US009158862B2

(12) United States Patent  
Whelan

(10) Patent No.: US 9,158,862 B2  
(45) Date of Patent: Oct. 13, 2015

(54) NARROWING COMPARISON RESULTS OF ASSOCIATIVE MEMORIES

(71) Applicant: The Boeing Company, Chicago, IL (US)

(72) Inventor: John Desmond Whelan, Burien, WA (US)

(73) Assignee: THE BOEING COMPANY, Chicago, IL (US)

( * ) Notice: Subject to any disclaimer, the term of this patent is extended or adjusted under 35 U.S.C. 154(b) by 210 days.

(21) Appl. No.: 13/689,217

(22) Filed: Nov. 29, 2012

(65) Prior Publication Data

US 2014/0149655 A1    May 29, 2014

(51) Int. Cl.  
*G06F 12/00* (2006.01)  
*G06F 17/30* (2006.01)  
*G11C 15/00* (2006.01)

(52) U.S. Cl.  
CPC .... *G06F 17/30982* (2013.01); *G06F 17/30595* (2013.01); *G11C 15/00* (2013.01)

(58) Field of Classification Search  
CPC .................. G06F 17/30595; G06F 17/30982; G06F 17/30675; G06F 17/30699; G11C 15/00  
See application file for complete search history.

(56) References Cited

U.S. PATENT DOCUMENTS

| 4,144,564 | A | 3/1979 | Lamb |
| 4,149,262 | A | 4/1979 | Lamb et al. |
| 5,014,327 | A | 5/1991 | Potter et al. |
| 7,822,750 | B2 * | 10/2010 | Duchon et al. ............. 707/738 |
| 2009/0083207 | A1 | 3/2009 | Aparicio, IV |
| 2010/0161566 | A1 * | 6/2010 | Adair et al. ............... 707/690 |
| 2010/0205192 | A1 * | 8/2010 | Quadracci et al. .......... 707/758 |
| 2013/0173639 | A1 * | 7/2013 | Chandra et al. ............ 707/754 |

OTHER PUBLICATIONS

Prokopenko et al., "Optimizing Associative Information Transfer Within Content-addressable Memory," International Journal of Unconventional Computation, vol. 3, Issue 3, Special issue: "Towards Theory of Unconventional Computing," 2008, pp. 273-296.

* cited by examiner

Primary Examiner — Cheng-Yuan Tseng  
Assistant Examiner — Rocio Del Mar Perez-Velez  
(74) Attorney, Agent, or Firm — Yee & Associates, P.C.

(57) ABSTRACT

A system including an associative memory. A first input device in communication with the associative memory is configured to receive comparison criteria associated with a first entity stored in the associative memory. A search engine is configured to acquire, using a processor in conjunction with the associative memory and also using the comparison criteria, an attribute category of the first entity and an attribute value of the first entity. A second input device is configured to input, using the processor in conjunction with the associative memory, the attribute category and the attribute value into a worksheet of the associative memory. A comparator is configured to compare, using the processor in conjunction with the associative memory, the first entity and a second entity. The comparator is further configured to apply the worksheet as part of comparing the first entity and the second entity.

20 Claims, 7 Drawing Sheets

FIG. 7

Perspective: Parts — 700

| Entity: abc-100x Attributes |
|---|
| Size:564mm |
| Weight:2lbs |
| Location:cabin |
| Type:altimeter |
| Manufacturer:xyz |
| Model:123, 456 |
| Series:100, 200 |
| Factory: renton |
| Region:nw |
| Material:plastic, m |
| Corrosion Resista |
| Rust Resistant:yes |
| Waterproof:yes |

Entities Like: abc-100x

| Score | Entity — 704 | Matching Attributes — 702 |
|---|---|---|
| 1.00 | def321-123 | Type:altimeter, Material:plastic, Model:123, Region:nw, Factory:renton, Location:cabin |
| 0.98 | 456b789 | Type:altimeter, Material:plastic, Model:123, Location:cabin, Factory:renton |
| 0.98 | vwx6789-1 | Type:altimeter, Material:plastic, Model:123, Location:cabin, Series 100 |
| 0.96 | a5432-123 | Type:altimeter, Location:cabin, Size:~564mm, Material:plastic |
| 0.82 | a98s765-1 | Type:altimeter, Manufacturer:xyz, Material:plastic |
| 0.82 | xa12345 | Location:cabin, Manufacturer:xyz, Model:123 |
| ⋮ | ⋮ | ⋮ |

FIG. 8

Perspective: Requisitions — 800

| Entity: XYZ Attributes |
|---|
| ⋮ |
| Programming Skills:Javi, |
| Office Skills:Work, Expel |
| Education:College |
| GRE:yes |
| GMAT:no |
| IQ:107 |
| Date:Summer, Autumn |
| Location:Seattle, Chicag |
| Experience:Web, Applica |
| ⋮ |

Entities Like: XYZ

| Score | Entity — 804 | Matching Attributes — 802 |
|---|---|---|
| 1.00 | ABC | Programming Skills:Javi, Date:Summer, Location:Seattle |
| 0.98 | DEF | Programming Skills:Javi, Location:Seattle |
| 0.98 | GHI | Programming Skills:Javi, Location:Seattle |
| 0.96 | JKL | Programming Skills:Javi, |
| 0.82 | MNO | Programming Skills:Javi, |
| ⋮ | ⋮ | ⋮ |

NARROWING COMPARISON RESULTS OF ASSOCIATIVE MEMORIES

BACKGROUND INFORMATION

1. Field

The present disclosure relates generally to associative memories and, in particular, a system and method for narrowing comparison results of associative memories.

2. Background

When using associative memories to perform entity comparisons, a difficulty can arise when attempting to narrow down search criteria in order to obtain specific results. For example, when searching for applicants within a technical domain, the task of narrowing the search down to a specific skill is difficult. For example, a user may have difficulty using the entity comparison capabilities of an associative memory to find an applicant having a certain number years of experience in a specific programming language.

The reason for this difficulty is that entity comparisons rely on attribute categories, like "Skill" and "Experience". However, entity comparisons do not consider the attribute values until a breadth-wide search is performed first, as the search pertains to the sought entity. Furthermore, the user is limited as to what information can be included within the comparison criteria. Thus, finding the desired specific information using an entity comparison can be difficult. However, the ability to find specific information using an entity comparison of an associative memory is desirable. In addition, since associative memory and entity analytics deal with both tangible and intangible data, in order for a comparison to be valid, the intangible attributes should be in the correct context when compared.

SUMMARY

The illustrative embodiments provide for a system. The system includes an associative memory comprising a plurality of data and a plurality of associations among the plurality of data. The plurality of data is collected into associated groups. The associative memory is configured to be queried based on at least indirect relationships among the plurality of data. The system further includes a first input device in communication with the associative memory. The input device configured to receive comparison criteria associated with a first entity stored in the associative memory. The system further includes a search engine configured to acquire, using a processor in conjunction with the associative memory and also using the comparison criteria, an attribute category of the first entity and an attribute value of the first entity. The system further includes a second input device configured to input, using the processor in conjunction with the associative memory, the attribute category and the attribute value into a worksheet of the associative memory. The system further includes a comparator configured to compare, using the processor in conjunction with the associative memory, the first entity and a second entity. The comparator is further configured to apply the worksheet as part of comparing the first entity and the second entity.

The illustrative embodiments also provide for a method implemented using a processor and an associative memory comprising a plurality of data and a plurality of associations among the plurality of data. The plurality of data is collected into associated groups, wherein the associative memory is configured to be queried based on at least indirect relationships among the plurality of data. The associative memory is stored on a non-transitory computer readable storage medium. The method includes receiving, in the associative memory, comparison criteria associated with a first entity stored in the associative memory. The method also includes acquiring, using the processor in conjunction with the associative memory and also using the comparison criteria, an attribute category of the first entity and an attribute value of the first entity. The method also includes entering, using the processor in conjunction with the associative memory, the attribute category and the attribute value into a worksheet of the associative memory. The method also includes comparing, using the processor in conjunction with the associative memory, the first entity and a second entity. Comparing further includes applying the worksheet as part of comparing the first entity and the second entity.

The illustrative embodiments also provide for a data processing system. The data processing system includes a processor, a bus connected to the processor, and a non-transitory computer readable storage medium connected to the bus. The non-transitory computer readable storage medium stores an associative memory comprising a plurality of data and a plurality of associations among the plurality of data. The plurality of data is collected into associated groups. The associative memory is configured to be queried based on at least indirect relationships among the plurality of data. The non-transitory computer readable storage medium further stores program code. The program code includes program code configured to receive, in the associative memory, comparison criteria associated with a first entity stored in the associative memory. The program code also includes program code configured to acquire, using the processor in conjunction with the associative memory and also using the comparison criteria, an attribute category of the first entity and an attribute value of the first entity. The program code also includes program code configured to enter, using the processor in conjunction with the associative memory, the attribute category and the attribute value into a worksheet of the associative memory. The program code also includes program code configured to compare, using the processor in conjunction with the associative memory, the first entity and a second entity. The program code configured to compare further includes program code configured to apply the worksheet as part of comparing the first entity and the second entity.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 7 is an example of general results of an entity comparison using an associative memory, in accordance with an illustrative embodiment;

FIG. 8 is an example of specific results of an entity comparison narrowed using a worksheet of an associative memory, in accordance with an illustrative embodiment.

DETAILED DESCRIPTION

Figure 1:
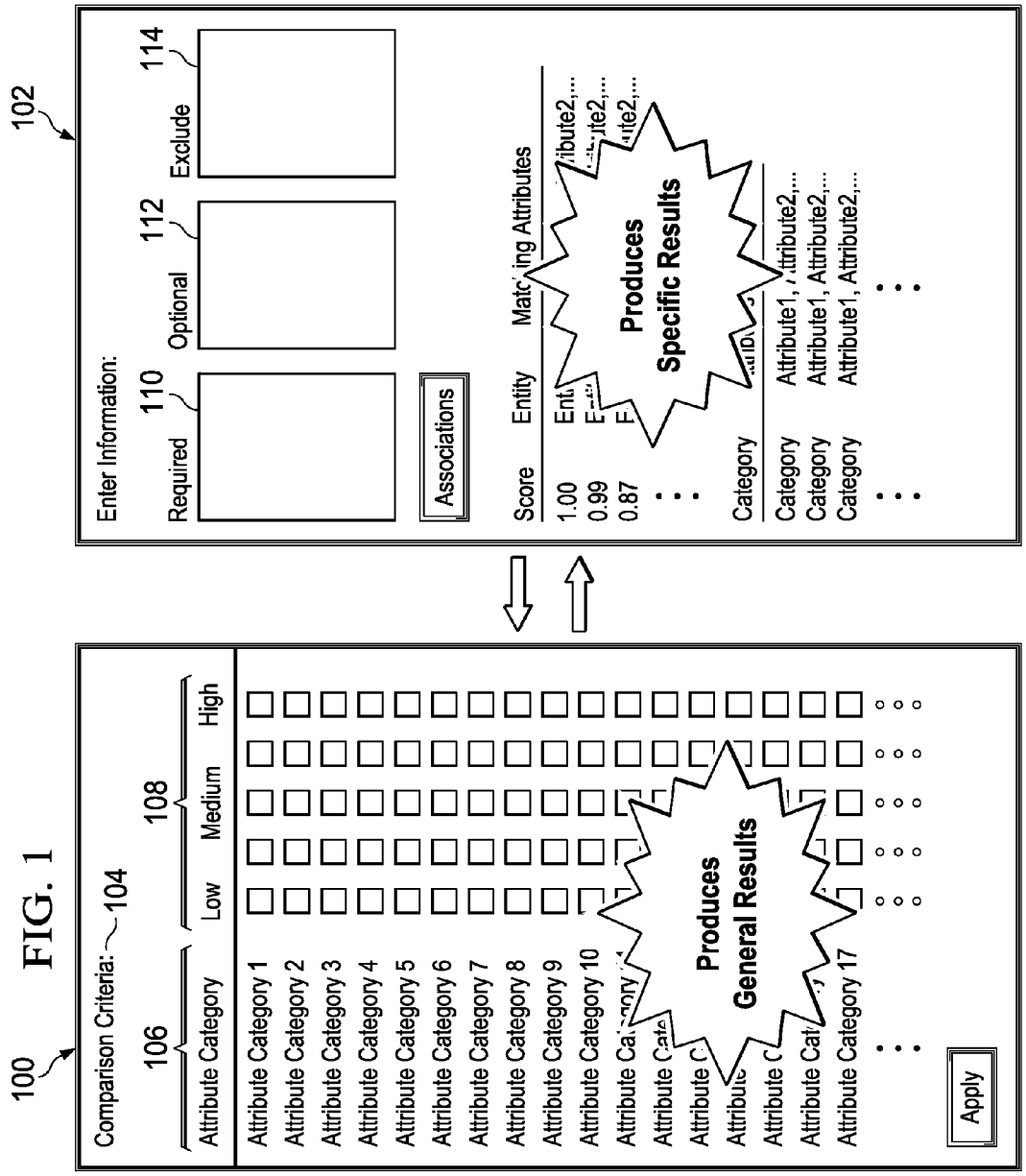
FIG. 1 is a diagram illustrating a difference between producing general results and specific results within an associative memory, in accordance with an illustrative embodiment.

The illustrative embodiments provide several useful functions. For example, the illustrative embodiments recognize and take into account that finding the desired specific information using an entity comparison feature of an associative memory can be difficult. Thus, the illustrative embodiments provide users the ability to create dynamic criteria for entity comparisons within an associative memory using worksheets. This ability allows users the flexibility to be more specific when designing criterion for their comparisons by utilizing explicit attribute values, instead of just attribute categories. The illustrative embodiments also help users obtain more relevant entity comparisons by utilizing attribute categories and values that are otherwise unobtainable.

The illustrative embodiments also recognize and take into account that use of entity comparisons alone or use of worksheets alone does not provide the desired narrow comparison results. The illustrative embodiments recognize and take into account that current associative memories are incapable of combining entity comparisons and worksheets because they operate on different principles of searching and comparison. For example, comparisons use predetermined categories and values generated by the memory in order to obtain the best results based on an associative algorithm. In addition, comparison results provide context. On the other hand, an associative memory search does not constrain the user whatsoever, allowing them to search freely. Searches do not benefit from the assistance the memory itself might be able to provide as well as additional information gained from the context of a query term. Thus, combining worksheets and entity comparisons was formerly impossible, as the two techniques operate on completely different principles of using data in an associative memory.

The illustrative embodiments also recognize and take into account that, when using associative memories to perform entity comparisons, narrowing search criteria in order to obtain specific results is difficult for the reasons given above. On the other hand, the illustrative embodiments recognize and take into account that worksheets allow users to specify actual values when performing a search; however, they are not bound to a particular entity. Thus, the illustrative embodiments recognize and take into account that the ability to allow users to manipulate their comparison criteria within a worksheet as it pertains to a particular entity, to save the criteria, then to apply it to that entity comparison would be useful and desirable.

The illustrative embodiments also provide a mechanism to ensure the context of intangible attributes are correct, thereby ensuring that the comparison studies are properly configured, not too broad and not too narrow. Since regular databases typically deal with only tangible attributes, this issue is not present in regular databases. However, with associative memories and entity analytics, this issue may become an important technical issue to be solved in order to be able to use the full potential of the associative memory and of entity analytics. This potential may be seen when making comparisons among unstructured data using an associative memory. Since unstructured data by definition lacks structure, traditional databases have a difficult time making "apple to apple" comparisons of unstructured data. Associative memories are capable of making such comparisons accurately, if configured correctly as described herein.

As used herein, the term "associative memory" refers to a plurality of data and a plurality of associations among the plurality of data. The plurality of data and the plurality of associations may be stored in a non-transitory computer readable storage medium. The plurality of data may be collected into associated groups. The associative memory may be configured to be queried based on at least indirect relationships among the plurality of data in addition to direct correlations among the plurality of data. Thus, an associative memory may be configured to be queried based solely on direct relationships, based solely on indirect relationships, as well as based on combinations of direct and indirect relationships.

Thus, an associative memory may be characterized as a plurality of data and a plurality of associations among the plurality of data. The plurality of data may be collected into associated groups. Further, the associative memory may be configured to be queried based on at least one relationship, selected from a group that includes direct and indirect relationships, or from among the plurality of data in addition to direct correlations among the plurality of data. An associative memory may also take the form of software. Thus, an associative memory also may be considered a process by which information is collected into associated groups in the interest of gaining new insight based on relationships rather than direct correlation. An associative memory my also take the form of hardware, such as specialized processors or a field programmable gate array.

As used herein, the term "entity" refers to an object that has a distinct, separate existence, though such existence need not be a material existence. Thus, abstractions and legal constructs may be regarded as entities. As used herein, an entity need not be animate.

As used herein, unless specified otherwise, the term "entity comparison" refers solely to an aspect of an associative memory. An entity comparison is used to identify similarities between one or more first entities stored in the associative memory and one or more second entities stored in the associative memory.

As used herein, unless specified otherwise, the term "worksheet" refers solely to an aspect of an associative memory. A worksheet allows input of specific values in order to perform an open ended search of an associative memory, as opposed to an entity comparison defined above. The input may be from a user, may be from the output of a program, or otherwise may be automatically retrieved by some computer instruction. The specific values of a worksheet may have three types: "required", "optional" or "excluded". The "required" entries form a logical conjunction (a Boolean "AND"), the "optional" entries form a logical disjunction (a Boolean "OR"), and the "exclude" entries form a logical negation (a Boolean "NOT").

FIG. 1 is a diagram illustrating a difference between producing general results and specific results within an associative memory, in accordance with an illustrative embodiment. Specifically, FIG. 1 illustrates a difference between entity comparison criteria 100 and worksheet criteria 102. Both entity comparison criteria 100 and worksheet criteria 102 may be considered as criteria for a "query" of an associative memory.

To better understand the differences between these two types of queries, attention is first turned to describing additional structures of an associative memory. An associative memory may be divided logically into perspectives. A perspective may provide a "point of view" or a context for a particular aspect of a user's domain. For example, "parts" could be a perspective within a commercial aircraft domain.

In addition, an associative memory may organize data into entities. An entity may be an instantiation of an entity type. For example, an entity type could be a part, whereas an entity would be an instantiation of that type. For example, an entity type could be "bolt" and the entity could be "bolt XYZ", which is a specific bolt.

Perspectives usually may represent one or more entity types. This arrangement allows users to view domain data from a perspective that is both beneficial to them and the memory.

Another property of associative memories is that each entity contains a set of attributes used to describe the entity. The associative memory may separate each attribute into a category and a corresponding value. A value can be either numeric or non-numeric. The associative memory may use the set of attributes when comparing entities.

Within an associative memory, the results of an entity comparison, using entity comparison criteria 100, may be an ordered list of entities that are "like" or "similar to" the original or sought entity within a perspective. An associative memory may collect all the matching attributes among these entities to formulate the list. The order of that list may depend on the significance of the matching attributes. Additionally, the ranking may correlate to the number of attributes found.

Entity comparisons, using entity comparison criteria 100, may be a result of two actions. First, the associative memory may select which of the entity's attributes (categories and values) to use. In some illustrative embodiments, a user can help the associative memory make its selection by creating comparison criteria 100. The comparison criteria may inform the memory of which attribute categories to evaluate when making a comparison.

The second action may involve actually searching the associative memory using the attributes collected from the first step. The final result of the search consists of entities, where a given resulting entity's attributes match the attributes of the sought entity.

To make accurate comparisons, the associative memory may rely on comparison criteria, such as comparison criteria 104. Comparison criteria 104 may take the form of specifying which attribute categories are important from list 106. Any given attribute category may also be assigned a weight, such as one of five weights shown in check boxes 108. Comparison criteria 104 may be selected by a user, predefined by the memory, or possibly provided from the output of another program or process. However comparison criteria 104 is received, the associative memory may strictly define the comparison criteria's format and usage. Thus the associative memory may limit the user when trying to ascertain specific results.

Attention is now turned to how an associative memory may perform a comparison. Obtaining an entity comparison may, itself, include two steps.

The first step may be to locate attribute values from a set of criteria. Typically, the set of criteria may only provide the memory with attribute categories. If a set of criteria does not exist, the memory may use a predefined set of criteria.

The second step may be to perform a search using the attribute values collected from the first step. In order to use only specific attribute values, a user would have to skip the first step. However, the search query is dependent on this step and skipping it would cause the associative memory to use erroneous information for the comparisons that might not otherwise relate to the original sought entity itself.

As a result, entity comparisons automatically use both steps and do not allow the user to deviate from this process in order to retain the validly of their comparisons. It is also for this reason that one cannot simply combine worksheets, described below, and entity comparisons.

In summary, in order to obtain relevant comparisons, an associative memory may use criteria derived from the attribute categories of each entity within a perspective. Usually, a subject-matter "expert" may assign weights to these categories, in order to strengthen their association with other attributes, thereby giving them more or less importance. Each weight may correspond to a level of importance represented in FIG. 1 as a range of checkboxes 108. A user could weigh lesser categories towards the lower end or not weigh them at all. Conversely, a user could weigh important or relevant categories towards the higher end.

Unfortunately, a problem may arise when a user attempts to fine-tune or narrow the results of a specific comparison. Because the criteria used is designed to incorporate just attribute categories rather than actual values, the comparisons tend to be wider and more varied relative to an open ended search. This fact is one aspect how entity comparisons differ from open ended searches, which may be performed using a worksheet.

Attention is now turned towards worksheet criteria 102. As defined above, as used herein, unless specified otherwise, the term "worksheet" refers solely to an aspect of an associative memory. A worksheet allows input of specific values in order to perform an open ended search of an associative memory, as opposed to an entity comparison defined above. The input may be from a user, may be from the output of a program including the associative memory itself, or otherwise may be automatically retrieved by some computer instruction. The specific values of a worksheet may have three types: required entries 110, optional entries 112, and excluded entries 114. Required entries 110 may form a logical conjunction (a Boolean "AND"). Optional entries 112 may form a logical disjunction (a Boolean "OR"). Excluded entries 114 may form a logical negation (a Boolean "NOT").

Worksheet criteria 102 may be used to perform open ended searches. In contrast to entity comparisons, open ended searches may produce exacting results but need to be formulated in such a way that they do not lose context when pertaining to a particular entity. These kinds of searches are best facilitated worksheet criteria 102. Worksheet criteria 102 may be used as input to perform a search an associative memory, as described above.

However, an issue that arises when using worksheets is that a user cannot perform an entity comparison. Thus, a user is again limited in performing a desired kind of search: an entity comparison with limited and exacting search results.

As an aid to understanding this issue, consider the following situation. A general requisition, labeled "requisition ABC" exists within an associative memory. Requisition ABC is a requisition to fill one or more open positions for employees having certain programming skills. The associative memory also contains information relating to employees and applicants for this position. As it stands, the requisition is broadly written and includes many programming skills. The requisition also includes a list of openings, which contain a few city locations along with some posting dates.

A user may be a person having the responsibility of filling requisition ABC for at least one position. The user may desire to locate other requisitions, similar to the requisition ABC, except the user desires to narrow the focus to highly skilled programmers in "language 1" in "city 2" for the at least one position.

The user could perform an entity comparison, but would obtain far too many results to be valuable because, for the reasons given above, an entity comparison has a very limited ability to focus results. The user could not use a worksheet to perform this comparison because the user desires to perform an entity comparison. Specifically, the desired entity comparison is to compare the entity the user has defined to all existing candidate entities in the associative memory. The illustrative embodiments address this issue.

Figure 2:
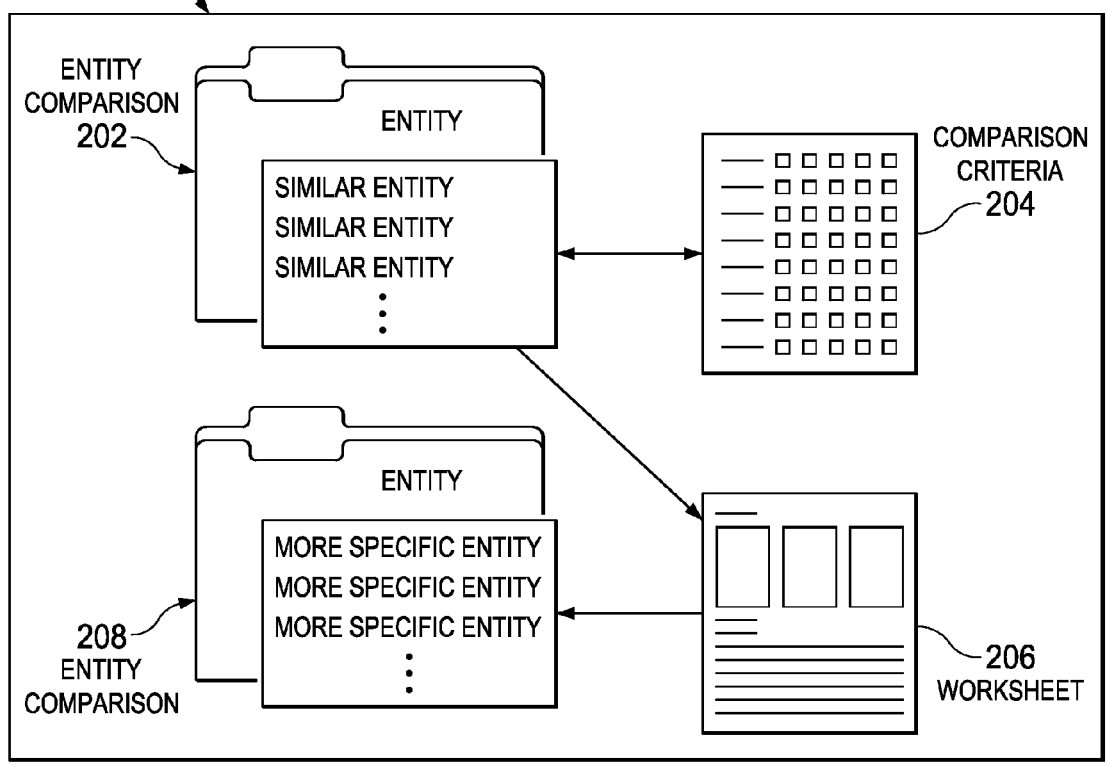
FIG. 2 is a diagram outlining the process for narrowing results of comparisons performed using an associative memory, in accordance with an illustrative embodiment.

FIG. 2 is a diagram outlining the process for narrowing results of comparisons performed using an associative memory, in accordance with an illustrative embodiment. In particular, block diagram 200 illustrates the functionality of a worksheet applied to an entity comparison.

To accomplish this goal, the illustrative embodiments first may use the associative memory to acquire the correct attributes of entity comparison 202 using comparison criteria 204. Then, the associative memory may pass the information it collects to worksheet 206. Worksheet 206 may provide an opportunity, automatically from program input or manually by user input, to manipulate the attribute values the associative memory collected. When finished, this information can be saved and applied towards the second entity comparison 208. Second entity comparison may be related to entity comparison 202.

Thus, the illustrative embodiments provide for the ability to inform an associative memory of what criteria to use when performing an entity comparison, by using an interface to that memory. This interface can vary in scope and functionality. However, the interface may preserve the job of defining the criteria in whatever capability the associative memory can handle.

The illustrative embodiments are not limited to entity comparisons of the same type. Thus, a comparison of entities of different types is possible. For example, a comparison may be made between applicant resumes and job requisitions.

The illustrative embodiments provide for several functions and capabilities not known in previous associative memory technologies. For example, the illustrative embodiments allow a user to focus on specific criteria as opposed to generalities. The illustrative embodiments can save comparison criteria for each entity, making them available for later use. The illustrative embodiments have more flexibility when manipulating comparison criteria.

For example, the illustrative embodiments allow exclusion of attributes. The illustrative embodiments allow a change of priorities of values within the same category. The illustrative embodiments allow a user to make and test changes, before applying the comparison criteria. The illustrative embodiments allow a user to tailor their criteria to specific business needs.

The illustrative embodiments have other functions and capabilities. For example, the illustrative embodiments avoid aspects of entity comparisons that user could find confusing, as the illustrative embodiments may place the entity comparisons closer to the actual results. The illustrative embodiments also may be subject matter independent and may be universally deployable. Thus, the functions and capabilities described above are not necessarily limiting of the claimed inventions.

Figure 3:
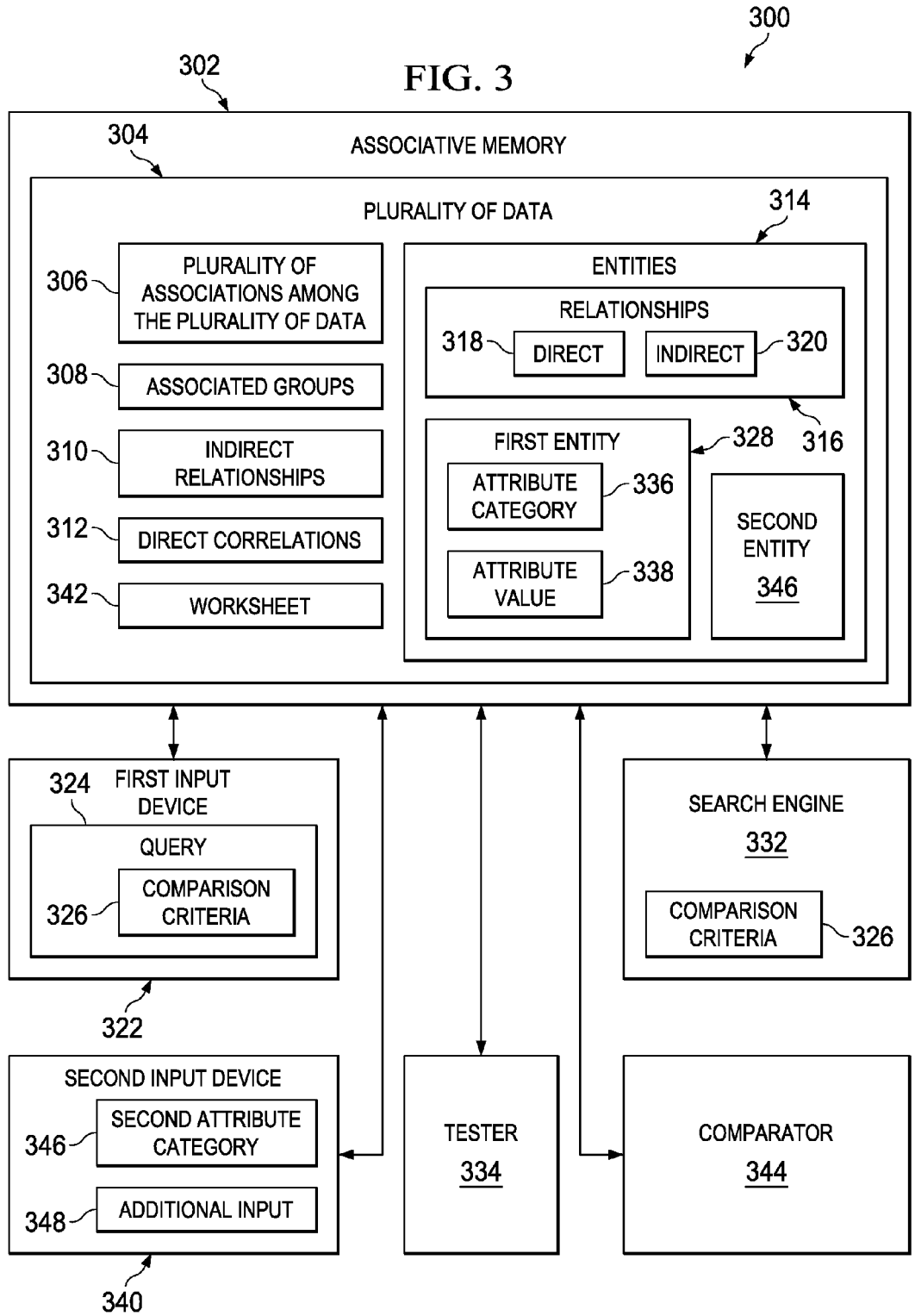
FIG. 3 is a block diagram illustrating a system for narrowing results of comparisons performed using an associative memory, in accordance with an illustrative embodiment.

FIG. 3 is a block diagram illustrating a system for narrowing results of comparisons performed using an associative memory, in accordance with an illustrative embodiment. System 300 shown in FIG. 3 may be implemented using one or more data processing systems, possibly in a distributed or networked environment, and possibly by a group of remotely administered data processing systems known as the "cloud". Each of the one or more data processing systems that implement system 300 may be data processing system 900 described with respect to FIG. 9, or variations thereof. System 300 may be characterized as including one or more blocks. Each of these blocks may be separate or may be part of a monolithic architecture.

System 300 may include associative memory 302. Associative memory 302 may include plurality of data 304 and plurality of associations among the plurality of data 306. Plurality of data 304 may be collected into associated groups 308. Associative memory 302 may be configured to be queried based on indirect relationships 310 among plurality of data 304 in addition to direct correlations 312 among plurality of data 304.

Associative memory 302 may store entities 314. Associative memory 302 may also store relationships 316, both direct 318 and indirect 320, among entities 314. Associative memory 302 may also store individual information about each of entities 312.

System 300 may include first input device 322 in communication with associative memory 302. First input device 322 may be configured to receive query 324 to compare entities 314 in associative memory 302. First input device 322 may be configured to receive comparison criteria 326 associated with first entity 328 among entities 314 stored in associative memory 302. Entities 314 may also include second entity 330.

First input device 322 may be a tangible device configured to receive input. Examples of first input device 322 include, but are not limited to, a keyboard, a mouse, a touch screen, a tangible processor configured to receive data, a data bus, a tangible voice recognition system, and other types of devices.

System 300 may also include search engine 332. Search engine 332 may be configured to acquire, using a processor in conjunction with associative memory 302 and also using comparison criteria 326, attribute category 336 of first entity 328, and attribute value 338 of first entity 328. In an illustrative embodiment, search engine 332 may be associative memory 302 itself.

System 300 may also include second input device 340. Second input device 340 may be configured to input, using the processor in conjunction with associative memory 302, attribute category 336 and attribute value 338 into worksheet 342 of associative memory 302. In an illustrative embodiment, first input device 332 and second input device 340 may be the same entity; in other words, first input device 322 may comprises second input device 340.

System 300 also may include comparator 344. Comparator 344 may be configured to compare, using the processor in conjunction with associative memory 302, first entity 328 and a second entity 346. Comparator 344 may be further configured to apply worksheet 342 as part of comparing first entity 328 and second entity 346. In an illustrative embodiment, comparator 344 may be associative memory 302 itself.

The illustrative embodiments may be varied from those described above. For example, first input device 322 may be configured to receive comparison criteria 326 from a user.

In another illustrative embodiment, system 300 may also include tester 334. Tester 334 may be configured to test additional changes to comparison criteria 326 before second input device 340 performs an input operation.

In another illustrative embodiment, second input device 340 may be further configured to receive additional input from a user. The additional input may be at least one of: a second attribute category or a modification of the attribute category.

In another illustrative embodiment, second input device 340 may be further configured to receive second attribute value 346 the attribute category 336. In this case, second input device 340 may be further configured to receive additional input 348 from a user. Additional input 348 may be at least one of: a first request to delete the attribute value, a second request to add a third attribute value of the attribute category, and a third request to modify one of the first attribute value and the second attribute value.

Other variations are possible. Thus, the illustrative embodiments described above are not necessarily limiting of the claimed inventions.

Figures 4, 5:
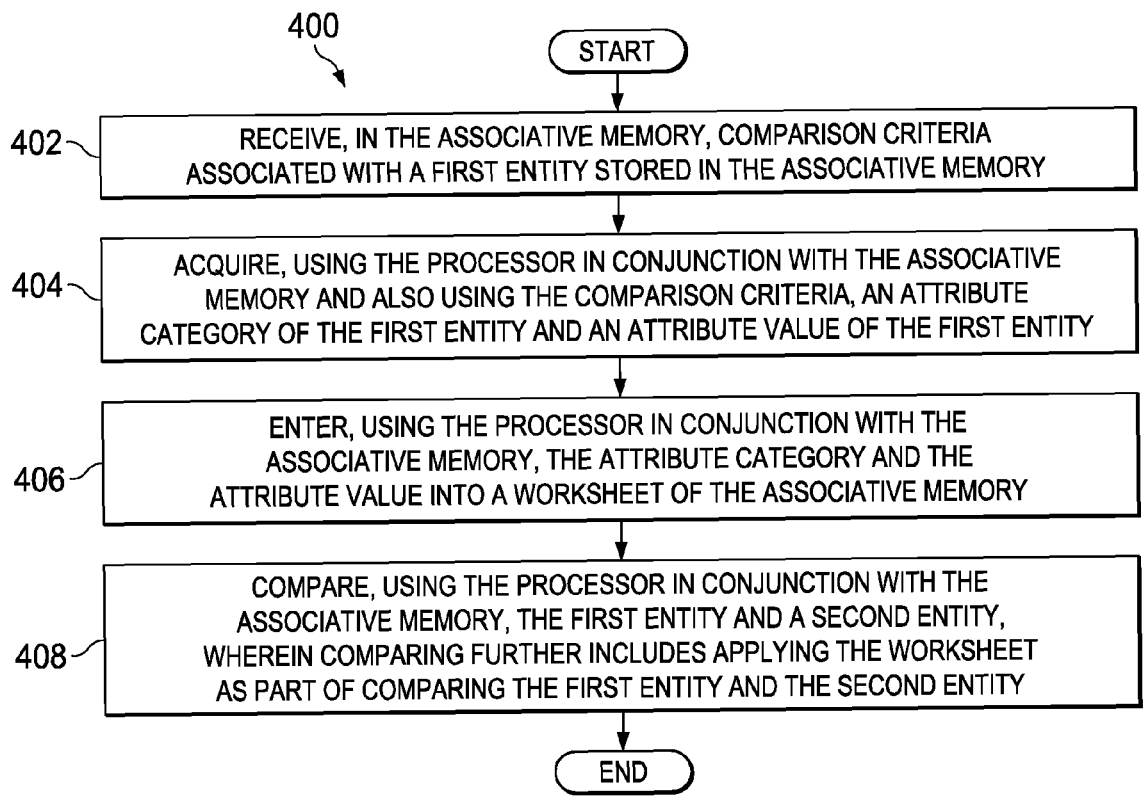
FIG. 4 is a flowchart illustrating a method for narrowing results of comparisons performed using an associative memory, in accordance with an illustrative embodiment.
FIG. 5 is an illustration of a sample request for user input to designate comparison criteria, in accordance with an illustrative embodiment.

FIG. 4 is a flowchart illustrating a method for narrowing results of comparisons performed using an associative memory, in accordance with an illustrative embodiment. Process 400 may be implemented by system 300 of FIG. 3 or data processing system 900 of FIG. 9. Process 400 may be a flow of, or an alternative to, the techniques described with respect to FIG. 2. With respect to FIG. 9, a "process" is described as performing an action. As used herein, a "process" is considered to be a non-transitory processor or other physical device configured to perform the action described, or may be considered to be a non-transitory computer readable storage medium storing computer usable program code configured, when executed, to carry out the action described.

Thus, the process may be implemented using a processor and an associative memory comprising a plurality of data and a plurality of associations among the plurality of data. The plurality of data may be collected into associated groups. The associative memory may be configured to be queried based on at least indirect relationships among the plurality of data. The associative memory may be stored on a non-transitory computer readable storage medium.

In an illustrative embodiment, the process may receive, in the associative memory, comparison criteria associated with a first entity stored in the associative memory (operation 402). The process then may acquire, using the processor in conjunction with the associative memory and also using the comparison criteria, an attribute category of the first entity and an attribute value of the first entity (operation 404).

The process then may enter, using the processor in conjunction with the associative memory, the attribute category and the attribute value into a worksheet of the associative memory (operation 406). The process then may compare, using the processor in conjunction with the associative memory, the first entity and a second entity, wherein comparing further includes applying the worksheet as part of comparing the first entity and the second entity (operation 408). In an illustrative embodiment, the process may terminate thereafter.

However, the illustrative embodiments may be varied from the above operations. In an illustrative embodiment, the comparison criteria may be received from a user via an input device. In an illustrative embodiment, the process may further include testing additional changes to the comparison criteria before entering. In still another variation, the process may further receive, after entering, additional input from a user via an input device, the additional input comprising at least one of: a second attribute category or a modification of the attribute category.

Other variations are possible, as the illustrative embodiments may include additional operations. For example, the process may receive a second attribute value of the attribute category after entering. In this case, the process may receive, after entering, additional input from a user via an input device. The additional input may be at least one of: a first request to delete the attribute value, a second request to add a third attribute value of the attribute category, and a third request to modify one of the first attribute value and the second attribute value.

The operations described above may be further varied. More or fewer operations may be present. Thus, the illustrative embodiments described above are not necessarily limiting of the claimed inventions.

FIG. 5 is an illustration of a sample request for user input to designate comparison criteria, in accordance with an illustrative embodiment. Sample user interface 500 provides an example of how a user may input comparison criteria into an associative memory, such as associative memory 302 of FIG. 3. Sample user interface 500 may be similar to entity comparison criteria 100 of FIG. 1, entity comparison criteria 204 of FIG. 2, or comparison criteria 326 of FIG. 3. The example shown in FIG. 5 is for explanatory purposes and may be widely varied from the example shown in FIG. 5, including but not limited to more or fewer attributes, more or fewer or different weightings, different selections of weightings, and may other variations.

In the particular illustrative embodiment shown in FIG. 5, sample user interface 500 may relate to the example of performing a narrow comparison criteria described with respect to FIG. 1. In particular, a user may be a person having the responsibility of filling requisition ABC for at least one position. The user may desire to locate other requisitions, similar to the requisition ABC, except the user desires to narrow the focus to highly skilled programmers in "language 1" in "city 2" for the at least one position.

As part of the initial comparison criteria, the user assigns attribute "Programming Skills" 502 a weighting value of "High" 504. The user also assigns attribute "date" 506 a weighting value of high 504 and assigns attribute "location" 508 a weighting value of "high" 504.

Thus, in this particular example, the user is attempting to find particular types of requisitions by comparing a designated type of requisition to other requisitions stored in the associative memory to identify similar additional types of requisitions. In order to locate these types of requisitions, the criteria for this comparison are created. Such criteria may use the attribute categories shown in FIG. 5. In particular, the user has designated the criteria described above and shown in FIG. 5. By selecting these categories, the user may tell the associative memory what is most important when making a comparison. As a result, the associative memory may locate the attribute values that correspond to these categories and to the designated type of requisition.

Depending on what the associative memory finds, the results can contain many different combinations of attribute categories and values. For example, a single category, such as Programming Skills 502, might return multiple answers, such as program language 1, program language 2, and program language 3. Then, the associative memory may use those values to find similar requisitions.

However, as described above, an issue with this type of comparison is that many of the requisitions for the position to be filled will contain many values never intended. Recall that the user is only interested in programming language 1, not the other two. Additionally, dates outside of the desired range may be present, and locations outside of the desired range may be present if the requisition applies to multiple locations.

A technique to address this issue is to give the user a bit more freedom and flexibility. Using the same requisition type, a user may locate similar requisitions for the position to be filled simply by applying or eliminating specific attribute values to or from the comparison. This process is shown in detail in FIG. 6, but also referred-to with respect to FIG. 1 through FIG. 4.

Figure 6:
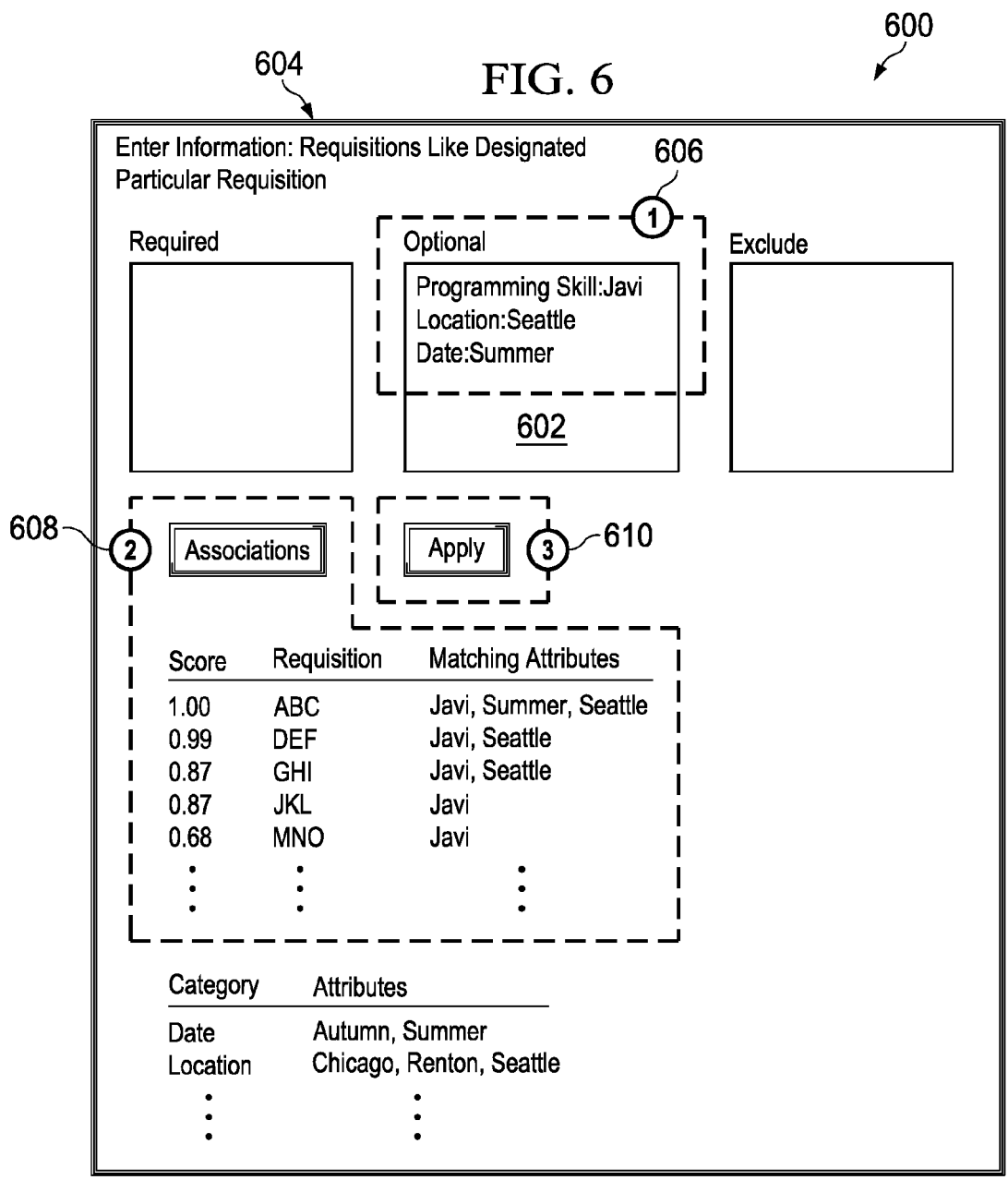
FIG. 6 is an illustration of a sample request for user input to modify a worksheet of an associative memory, in accordance with an illustrative embodiment.

FIG. 6 is an illustration of a sample request for user input to modify a worksheet of an associative memory, in accordance with an illustrative embodiment. Sample user interface 600 provides an example of how a user may modify comparison criteria 602 that have been placed into worksheet 604 by the associative memory. Sample user interface 600 may be similar to worksheet 200 of FIG. 1 or second input device 340 of FIG. 3. The example shown in FIG. 6 is for explanatory purposes and may be widely varied from the example shown in FIG. 6, including but not limited to striking more or fewer attributes, the inclusion of additional attributes, the modification of attributes, entry of attributes into additional input boxes such as "required" and "exclude", the provision of more or fewer input boxes, different types of input boxes, and may other variations.

The illustrative embodiments allow the user the same ability to enter comparison criteria as shown with respect to FIG. 5. The associative memory may then use these comparison criteria to acquire attribute categories and values as it pertains to the entity in question. With respect to above, the entity in question is the particular requisition in which the user is interested.

Then, as shown at circle 1 606 the associative memory may place the attribute categories and values obtained from the first step of a comparison into a section of worksheet 604. In this illustrative embodiment, the attribute categories and values are placed in "optional" box, though they could be placed in the "required" box or the "exclude" box, or a combination thereof.

At this point, the user may manipulate the information in order to isolate the exact attribute values that are desired. In this example, a user may delete information the user deems extraneous. However, the user may also move attribute values and/or categories to the boxes of worksheet 604. For example, the user could "require" other attribute categories or "exclude" others. The user may add additional information to any box; the additional information not provided by the associative memory via the initial entity comparison. In other illustrative embodiments, the associative memory may manipulate or select certain attributes or values with respect to worksheet 604, in place of or perhaps in addition to the user.

In an illustrative embodiment, worksheet 604 also may allow the user to test input criteria, as shown at circle 2 608. By testing the input criteria, the user may view sample results before running a full search. In this manner, the user may save time by determining whether additional narrowing attributes or attribute values are desirable.

Once the user is satisfied with the results, the associative memory can apply worksheet 604 to the comparison, as shown at circle 3 610. The result is a comparison that provides the specific information the user seeks to find for a narrow comparison. For example, when applied to the comparison of the particular requisition to other requisitions in the associative memory, the results yield other requisitions that specifically match the requirements for requisition in question. However, in some illustrative embodiments, these results might only apply to this particular entity (the requisition in question) and to no others. Consequently, in some cases, the specific comparison might be used globally.

The illustrative embodiments have a number of applications. For example, the illustrative embodiments provide an efficient technique for leveraging specific information across large datasets via an associative memory, in order to save costs in terms of actual money, human resources, and processing power. The illustrative embodiments can provide extremely accurate entity comparisons. The illustrative embodiments may allow a user more flexibility when making comparisons using an associative memory.

The illustrative embodiments could be used to isolate specific problems within vehicle parts, which would otherwise be difficult to locate. The illustrative embodiments could be used as a means of reproducing specific failures by drawing a close comparison with other failures of a similar nature. The illustrative embodiments could be used to locate highly skilled applicants for specific job requisitions, as described above. The illustrative embodiments could be used in military applications or defense applications in order to quickly find solutions to dynamic problems, or to quickly evaluate options or strategies in combat situations. Many other applications are possible.

FIG. 7 is an example of general results of an entity comparison using an associative memory, in accordance with an illustrative embodiment. FIG. 8 is an example of specific results of an entity comparison narrowed using a worksheet of an associative memory, in accordance with an illustrative embodiment. Together, FIG. 7 and FIG. 8 illustrate a use of the illustrative embodiments described above with respect to FIG. 1 through FIG. 6.

In particular, FIG. 7 shows results 700 created by a typical comparison, performed in a perspective of an associative memory, between a desired part and other parts stored in the associative memory. As can be seen, the resulting matching attributes 702 are fairly populous, and the number of entities 704 returned is undesirably high.

In contrast, FIG. 8 shows results 800 obtained according to the illustrative embodiments described with respect to FIG. 1 through FIG. 6. In particular, FIG. 8 shows results 800 obtained by performing a comparison using an associative memory, entering the results of the comparison into a worksheet of the associative memory, and then searching based on the worksheet or performing a new comparison using the worksheet as input. Relative to matching attributes 702 in FIG. 7, matching attributes 802 of FIG. 8 show only those matching attributes in which the user is interested.

Additionally, only those entities having these matching attributes are shown. Thus, relative to number of entities 704 in FIG. 7, number of entities 804 of FIG. 8 has far fewer matching entities. Thus, a much more specific comparison result is obtained, relative to a typical comparison result performed in an associative memory.

Figure 9:
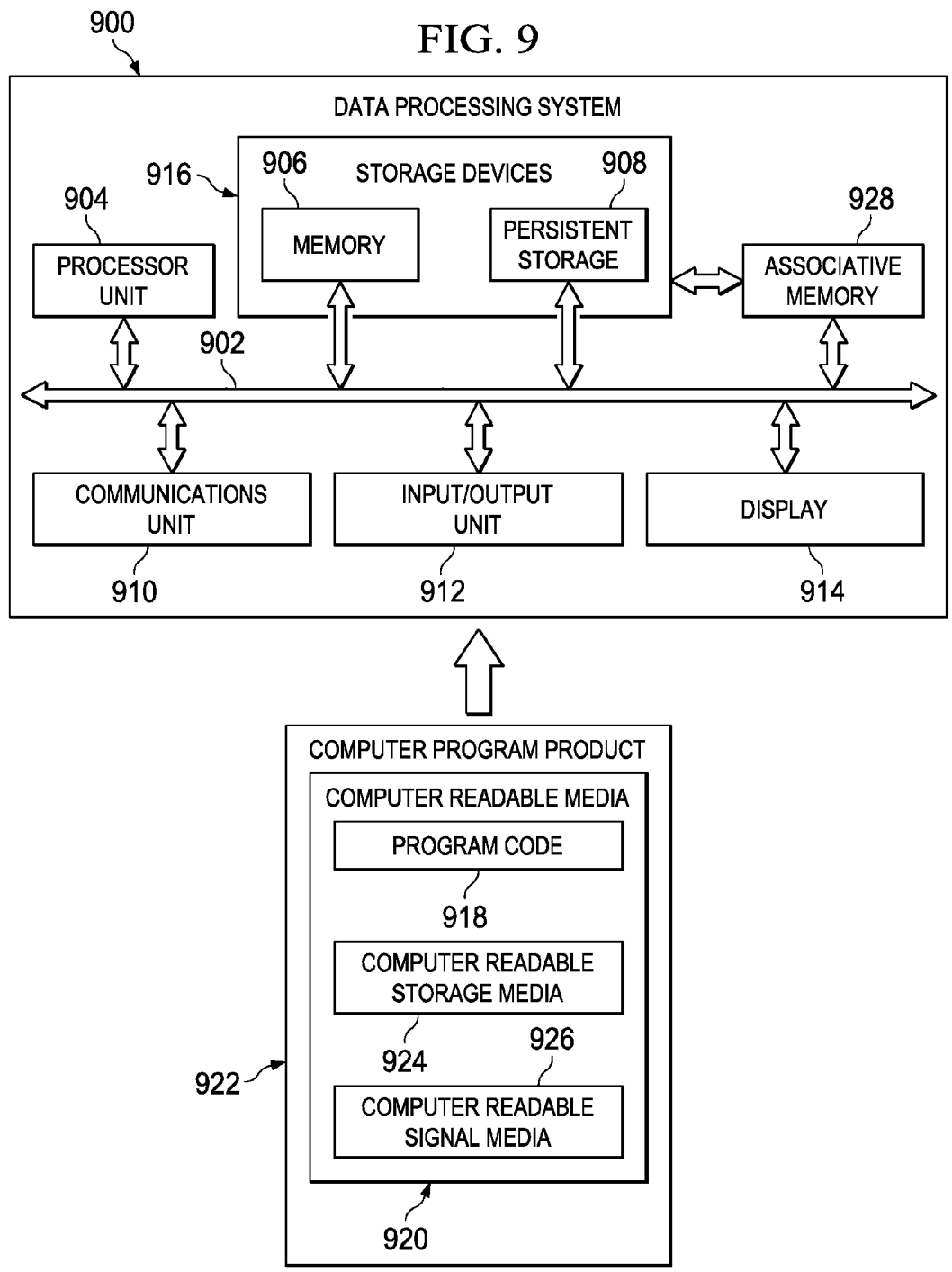
FIG. 9 is a block diagram illustrating a data processing system, in accordance with an illustrative embodiment.

Turning now to FIG. 9, an illustration of a data processing system is depicted in accordance with an illustrative embodiment. Data processing system 900 in FIG. 9 is an example of a data processing system that may be used to implement the illustrative embodiments, such as system 300 of FIG. 3, or any other module or system or process disclosed herein. In this illustrative example, data processing system 900 includes communications fabric 902, which provides communications between processor unit 904, memory 906, persistent storage 908, communications unit 910, input/output (I/O) unit 912, and display 914.

Processor unit 904 serves to execute instructions for software that may be loaded into memory 906. Processor unit 904 may be a number of processors, a multi-processor core, or some other type of processor, depending on the particular implementation. A number, as used herein with reference to an item, means one or more items. Further, processor unit 904 may be implemented using a number of heterogeneous processor systems in which a main processor is present with secondary processors on a single chip. As another illustrative example, processor unit 904 may be a symmetric multi-processor system containing multiple processors of the same type.

Memory 906 and persistent storage 908 are examples of storage devices 916. A storage device is any piece of hardware that is capable of storing information, such as, for example, without limitation, data, program code in functional form, and/or other suitable information either on a temporary basis and/or a permanent basis. Storage devices 916 may also be referred to as computer readable storage devices in these examples. Memory 906, in these examples, may be, for example, a random access memory or any other suitable volatile or non-volatile storage device. Persistent storage 908 may take various forms, depending on the particular implementation.

For example, persistent storage 908 may contain one or more components or devices. For example, persistent storage 908 may be a hard drive, a flash memory, a rewritable optical disk, a rewritable magnetic tape, or some combination of the above. The media used by persistent storage 908 also may be removable. For example, a removable hard drive may be used for persistent storage 908.

Communications unit 910, in these examples, provides for communications with other data processing systems or devices. In these examples, communications unit 910 is a network interface card. Communications unit 910 may provide communications through the use of either or both physical and wireless communications links.

Input/output (I/O) unit 912 allows for input and output of data with other devices that may be connected to data processing system 900. For example, input/output (I/O) unit 912 may provide a connection for user input through a keyboard, a mouse, and/or some other suitable input device. Further, input/output (I/O) unit 912 may send output to a printer. Display 914 provides a mechanism to display information to a user.

Instructions for the operating system, applications, and/or programs may be located in storage devices 916, which are in communication with processor unit 904 through communications fabric 902. In these illustrative examples, the instructions are in a functional form on persistent storage 908. These instructions may be loaded into memory 906 for execution by processor unit 904. The processes of the different embodiments may be performed by processor unit 904 using computer implemented instructions, which may be located in a memory, such as memory 906.

These instructions are referred to as program code, computer usable program code, or computer readable program code that may be read and executed by a processor in processor unit 904. The program code in the different embodiments may be embodied on different physical or computer readable storage media, such as memory 906 or persistent storage 908.

Program code 918 is located in a functional form on computer readable media 920 that is selectively removable and may be loaded onto or transferred to data processing system 900 for execution by processor unit 904. Program code 918 and computer readable media 920 form computer program product 922 in these examples. In one example, computer readable media 920 may be computer readable storage media 924 or computer readable signal media 926. Computer readable storage media 924 may include, for example, an optical or magnetic disk that is inserted or placed into a drive or other device that is part of persistent storage 908 for transfer onto a storage device, such as a hard drive, that is part of persistent storage 908. Computer readable storage media 924 also may take the form of a persistent storage, such as a hard drive, a thumb drive, or a flash memory, that is connected to data processing system 900. In some instances, computer readable storage media 924 may not be removable from data processing system 900.

Alternatively, program code 918 may be transferred to data processing system 900 using computer readable signal media 926. Computer readable signal media 926 may be, for example, a propagated data signal containing program code 918. For example, computer readable signal media 926 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 918 may be downloaded over a network to persistent storage 908 from another device or data processing system through computer readable signal media 926 for use within data processing system 900. For instance, program code stored in a computer readable storage medium in a server data processing system may be downloaded over a network from the server to data processing system 900. The data processing system providing program code 918 may be a server computer, a client computer, or some other device capable of storing and transmitting program code 918.

The different components illustrated for data processing system 900 are not meant to provide architectural limitations to the manner in which different embodiments may be implemented. The different illustrative embodiments may be implemented in a data processing system including components in addition to or in place of those illustrated for data processing system 900. Other components shown in FIG. 9 can be varied from the illustrative examples shown. The different embodiments may be implemented using any hardware device or system capable of running program code. As one example, the data processing system may include organic components integrated with inorganic components and/or may be comprised entirely of organic components excluding a human being. For example, a storage device may be comprised of an organic semiconductor.

In another illustrative example, processor unit 904 may take the form of a hardware unit that has circuits that are manufactured or configured for a particular use. This type of hardware may perform operations without needing program code to be loaded into a memory from a storage device to be configured to perform the operations.

For example, when processor unit 904 takes the form of a hardware unit, processor unit 904 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, programmable array logic, a field programmable logic array, a field programmable gate array, and other suitable hardware devices. With this type of implementation, program code 918 may be omitted because the processes for the different embodiments are implemented in a hardware unit.

In still another illustrative example, processor unit 904 may be implemented using a combination of processors found in computers and hardware units. Processor unit 904 may have a number of hardware units and a number of processors that are configured to run program code 918. With this depicted example, some of the processes may be implemented in the number of hardware units, while other processes may be implemented in the number of processors.

As another example, a storage device in data processing system 900 is any hardware apparatus that may store data. Memory 906, persistent storage 908, and computer readable media 920 are examples of storage devices in a tangible form.

In another example, a bus system may be used to implement communications fabric 902 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 906, or a cache, such as found in an interface and memory controller hub that may be present in communications fabric 902.

Data processing system 900 may also include associative memory 928. Associative memory 928 may be associative memory 302 of FIG. 3, and may have the properties described elsewhere herein. Associative memory 928 may be in communication with communications fabric 902. Associative memory 928 may also be in communication with, or in some illustrative embodiments, be considered part of storage devices 916. While one associative memory 928 is shown, additional associative memories may be present.

The different illustrative embodiments can take the form of an entirely hardware embodiment, an entirely software embodiment, or an embodiment containing both hardware and software elements. Some embodiments are implemented in software, which includes but is not limited to forms, such as, for example, firmware, resident software, and microcode.

Furthermore, the different embodiments can take the form of a computer program product accessible from a computer usable or computer readable medium providing program code for use by or in connection with a computer or any device or system that executes instructions. For the purposes of this disclosure, a computer usable or computer readable medium can generally be any tangible apparatus that can contain, store, communicate, propagate, or transport the program for use by or in connection with the instruction execution system, apparatus, or device.

The computer usable or computer readable medium can be, for example, without limitation an electronic, magnetic, optical, electromagnetic, infrared, or semiconductor system, or a propagation medium. Non-limiting examples of a computer readable medium include a semiconductor or solid state memory, magnetic tape, a removable computer diskette, a random access memory (RAM), a read-only memory (ROM), a rigid magnetic disk, and an optical disk. Optical disks may include compact disk-read only memory (CD-ROM), compact disk-read/write (CD-R/W), and DVD.

Further, a computer usable or computer readable medium may contain or store a computer readable or usable program code such that when the computer readable or usable program code is executed on a computer, the execution of this computer readable or usable program code causes the computer to transmit another computer readable or usable program code over a communications link. This communications link may use a medium that is, for example without limitation, physical or wireless.

A data processing system suitable for storing and/or executing computer readable or computer usable program code will include one or more processors coupled directly or indirectly to memory elements through a communications fabric, such as a system bus. The memory elements may include local memory employed during actual execution of the program code, bulk storage, and cache memories which provide temporary storage of at least some computer readable or computer usable program code to reduce the number of times code may be retrieved from bulk storage during execution of the code.

Input/output or I/O devices can be coupled to the system either directly or through intervening I/O controllers. These devices may include, for example, without limitation, keyboards, touch screen displays, and pointing devices. Different communications adapters may also be coupled to the system to enable the data processing system to become coupled to other data processing systems or remote printers or storage devices through intervening private or public networks. Non-limiting examples of modems and network adapters are just a few of the currently available types of communications adapters.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A system comprising:
an associative memory comprising a plurality of data and a plurality of associations among the plurality of data, wherein the plurality of data is collected into associated groups, wherein the associative memory is configured to be queried based on at least indirect relationships among the plurality of data;
a first input device in communication with the associative memory, the input device configured to receive comparison criteria associated with a first entity stored in the associative memory;
a search engine configured to acquire, using a processor in conjunction with the associative memory and also using the comparison criteria, an attribute category of the first entity and an attribute value of the first entity;
a second input device configured to input, using the processor in conjunction with the associative memory, the attribute category and the attribute value into a worksheet of the associative memory, wherein the worksheet includes a plurality of worksheet criteria for receiving the attribute category and the attribute value; and a comparator configured to compare, using the processor in conjunction with the associative memory, the first entity and a second entity to form a comparison, wherein the comparator is further configured to apply the worksheet, using the plurality of worksheet criteria, as part of comparing the first entity and the second entity.

2. The system of claim 1, wherein the search engine comprises the associative memory.

3. The system of claim 1, wherein the first input device comprises the second input device.

4. The system of claim 1, wherein the first input device is configured to receive the comparison criteria from a user.

5. The system of claim 4 further comprising:
a tester configured to test additional changes to the comparison criteria before the second input device performs an input operation.

6. The system of claim 1, wherein the second input device is further configured to receive additional input from a user, the additional input comprising at least one of: a second attribute category or a modification of the attribute category.

7. The system of claim 1, wherein:
the second input device is further configured to receive a second attribute value of the attribute category; and
the second input device is further configured to receive additional input from a user, the additional input comprising at least one of: a first request to delete the attribute value, a second request to add a third attribute value of the attribute category, and a third request to modify one of the first attribute value and the second attribute value.

8. A method implemented using a processor and an associative memory comprising a plurality of data and a plurality of associations among the plurality of data, wherein the plurality of data is collected into associated groups, wherein the associative memory is configured to be queried based on at least indirect relationships among the plurality of data, and wherein the associative memory is stored on a non-transitory computer readable storage medium, the method comprising:
receiving, in the associative memory, comparison criteria associated with a first entity stored in the associative memory;
acquiring, using the processor in conjunction with the associative memory and also using the comparison criteria, an attribute category of the first entity and an attribute value of the first entity;
entering, using the processor in conjunction with the associative memory, the attribute category and the attribute value into a worksheet of the associative memory, wherein the worksheet includes a plurality of worksheet criteria for receiving the attribute category and the attribute value; and
comparing, using the processor in conjunction with the associative memory, the first entity and a second entity to form a comparison, wherein comparing further includes applying the worksheet, using the plurality of worksheet criteria, as part of comparing the first entity and the second entity.

9. The method of claim 8, wherein the comparison criteria is received from a user via an input device.

10. The method of claim 9 further comprising:
testing additional changes to the comparison criteria before entering.

11. The method of claim 8 further comprising:
receiving, after entering, additional input from a user via an input device, the additional input comprising at least one of: a second attribute category or a modification of the attribute category.

12. The method of claim 8 further comprising:
receiving a second attribute value of the attribute category after entering; and
receiving, after entering, additional input from a user via an input device, the additional input comprising at least one of: a first request to delete the attribute value, a second request to add a third attribute value of the attribute category, and a third request to modify one of the first attribute value and the second attribute value.

13. A data processing system comprising:
a processor;
a bus connected to the processor;
a non-transitory computer readable storage medium connected to the bus, the non-transitory computer readable storage medium storing an associative memory comprising a plurality of data and a plurality of associations among the plurality of data, wherein the plurality of data is collected into associated groups, wherein the associative memory is configured to be queried based on at least indirect relationships among the plurality of data, and wherein the non-transitory computer readable storage medium further stores program code comprising:
program code configured to receive, in the associative memory, comparison criteria associated with a first entity stored in the associative memory;
program code configured to acquire, using the processor in conjunction with the associative memory and also using the comparison criteria, an attribute category of the first entity and an attribute value of the first entity;
program code configured to enter, using the processor in conjunction with the associative memory, the attribute category and the attribute value into a worksheet of the associative memory, wherein the worksheet includes a plurality of worksheet criteria for receiving the attribute category and the attribute value; and
program code configured to compare, using the processor in conjunction with the associative memory, the first entity and a second entity to form a comparison, wherein the program code configured to compare further includes program code configured to apply the worksheet, using the plurality of worksheet criteria, as part of comparing the first entity and the second entity.

14. The data processing system of claim 13, wherein the comparison criteria comprises user input.

15. The data processing system of claim 14, wherein the program code further comprises:
program code configured to test additional changes to the comparison criteria before entering.

16. The data processing system of claim 13, wherein the program code further comprises:
program code configured to receive, after entering, additional input from a user via an input device, the additional input comprising at least one of: a second attribute category or a modification of the attribute category.

17. The data processing system of claim 13, wherein the program code further comprises:
program code configured to receive a second attribute value of the attribute category after entering; and
program code configured to receive, after entering, additional input from a user via an input device, the additional input comprising at least one of: a first request to delete the attribute value, a second request to add a third attribute value of the attribute category, and a third request to modify one of the first attribute value and the second attribute value.

18. The system of claim 1, wherein the worksheet refers solely to an aspect of the associative memory.

19. The system of claim 1, wherein the plurality of worksheet criteria are selected from the group consisting of a required input, an optional input, an excluded input, and combinations thereof.

20. The method of claim 8, wherein the worksheet refers solely to an aspect of the associative memory, and wherein the plurality of worksheet criteria are selected from the group consisting of a required input, an optional input, an excluded input, and combinations thereof.

* * * * *